United States Patent
Brauchler et al.

(10) Patent No.: US 10,992,346 B2
(45) Date of Patent: Apr. 27, 2021

(54) SYSTEMS AND DEVICES WITH COMMON MODE NOISE SUPPRESSION STRUCTURES AND METHODS

(71) Applicants: Fred T. Brauchler, Canton, MI (US); Qiang Li, Gilbert, AZ (US)

(72) Inventors: Fred T. Brauchler, Canton, MI (US); Qiang Li, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 808 days.

(21) Appl. No.: 14/225,764

(22) Filed: Mar. 26, 2014

(65) Prior Publication Data

US 2015/0280785 A1 Oct. 1, 2015

(51) Int. Cl.
*H04B 5/00* (2006.01)
*H01L 49/02* (2006.01)

(52) U.S. Cl.
CPC .......... *H04B 5/0018* (2013.01); *H04B 5/005* (2013.01); *H04B 5/0031* (2013.01); *H04B 5/0075* (2013.01); *H01L 28/10* (2013.01); *H01L 28/60* (2013.01); *H01L 2224/48247* (2013.01); *H01L 2924/181* (2013.01)

(58) Field of Classification Search
CPC ...................................................... H04B 5/00
See application file for complete search history.

(56) References Cited

U.S. PATENT DOCUMENTS

| | | | |
|---|---|---|---|
| 4,780,795 A | * | 10/1988 | Meinel ............... H01F 17/062 174/538 |
| 6,054,780 A | | 4/2000 | Haigh et al. |
| 6,873,065 B2 | | 3/2005 | Haigh et al. |
| 7,112,457 B2 | | 9/2006 | Kek et al. |
| 7,582,960 B2 | | 9/2009 | Karnezos |

(Continued)

FOREIGN PATENT DOCUMENTS

| | | | |
|---|---|---|---|
| EP | 2509106 A1 | 10/2012 | |
| WO | 2010137090 A1 | 12/2010 | |
| WO | WO-2010137090 A1 | * 12/2010 | ............. H01L 25/16 |

OTHER PUBLICATIONS

Final Rejection dated Nov. 5, 2015 for U.S. Appl. No. 13/930,250, 18 pages.

(Continued)

*Primary Examiner* — Steven B Gauthier
*Assistant Examiner* — Christopher A Culbert
(74) *Attorney, Agent, or Firm* — Sherry W. Schumm (57) ABSTRACT

An embodiment of a transformer-based system or galvanic isolation device includes a first coil, a second coil aligned with the first coil across a gap, and a first capacitor coupled between the first coil and a first voltage reference. A first electrode of the first capacitor may be formed from a conductive electrode structure that is electrically isolated from the first coil, and a second electrode of the first capacitor may be formed from at least a portion of the first coil. The system or device also may include a second capacitor coupled between the second coil and a second voltage reference. The first and second coils may form portions of first and second IC die, respectively, and the system or device may also include one or more dielectric components within the gap between the IC die, where the dielectric component(s) are positioned directly between the first and second coils.

16 Claims, 7 Drawing Sheets

(56) References Cited

U.S. PATENT DOCUMENTS

| | | | |
|---|---|---|---|
| 7,692,444 B2* | 4/2010 | Chen | H01F 17/0006 257/531 |
| 7,709,944 B2 | 5/2010 | Kuan et al. | |
| 8,203,214 B2 | 6/2012 | Bathan et al. | |
| 8,237,534 B2 | 8/2012 | Fouquet et al. | |
| 8,427,844 B2 | 4/2013 | Ho et al. | |
| 8,571,360 B2 | 10/2013 | Tay et al. | |
| 8,592,944 B2 | 11/2013 | Santangelo et al. | |
| 8,674,800 B2 | 3/2014 | Willkofer et al. | |
| 9,466,413 B2 | 10/2016 | Brauchler et al. | |
| 2010/0148911 A1* | 6/2010 | Fouquet | H01F 27/2804 336/200 |
| 2010/0328902 A1 | 12/2010 | Ho et al. | |
| 2011/0001587 A1 | 1/2011 | Sutardja | |
| 2011/0049693 A1 | 3/2011 | Nakashiba et al. | |
| 2011/0176339 A1 | 7/2011 | Kerber et al. | |
| 2012/0086867 A1* | 4/2012 | Kesler | H03H 7/40 348/730 |
| 2014/0070420 A1 | 3/2014 | Sapone | |
| 2015/0001948 A1 | 1/2015 | Brauchler | |
| 2015/0004902 A1 | 1/2015 | Pigott et al. | |

OTHER PUBLICATIONS

Non-Final Rejection dated Sep. 29, 2015 for U.S. Appl. No. 14/812,242, 5 pages.
Notice of Allowance dated Aug. 20, 2015 for U.S. Appl. No. 14/573,674, 9 pages.
Canegallo, R. et al, "3D Contactless Communication for IC Design," IEEE International Conference on Integrated Circuit Design and Technology and Tutorial; Jun. 2-4, 2008; ISBN 978-1-4244-1810-7; pp. 241-244.
European Search Report dated Oct. 29, 2014, for EP 14173336, 7 pages.
Wayne, S., "iCoupler Digital Isolators Protect RS-232, RS-485, and CAN Buses in Industrial, Instrumentation, and Computer Applications", Analog Dialogue 39-10, http://www.analog.com/analogdialogue, Oct. 2005, pp. 1-4.
Krakauer, D., "Anatomy of a Digital Isolator", Analog Devices, Technical Article MS-2234, www.analog.com, Oct. 2011, pp. 1-3.
Chen, B., "iCoupler Products with isoPower Technology: Signal and Power Transfer Across Isolation Barrier Using Microtransformers", Analog Devices, www.analog.com, Apr. 2006, pp. 1-4.
Avago Technologies, "ACPL-M71U and ACPL-M72U, Wide Operating Temperature, High Speed, Low Power Digital Optocouplers with R2Coupler Isolation", Data Sheet, www.avagotech.com, Oct. 5, 2012, pp. 1-11.
Non-Final Rejection dated Jul. 22, 2015 for U.S. Appl. No. 13/930,250, 22 pages.
Notice of Allowance dated May 22, 2015 for U.S. Appl. No. 14/104,355, 11 pages.
Notice of Allowance dated Jul. 22, 2015 for U.S. Appl. No. 14/573,674, 9 pages.
Notice of Allowance dated Jun. 22, 2016 for U.S. Appl. No. 14/573,674, 9 pages.
Texas Instruments;"ISO722x Dual-Channel Digital Isolators"; Data Sheet; 38 pages (Jul. 2006—Revised Aug. 2018).
Notice of Allowance; U.S. Appl. No. 14/812,242; 18 pages (dated Feb. 10, 2016).

* cited by examiner

SYSTEMS AND DEVICES WITH COMMON MODE NOISE SUPPRESSION STRUCTURES AND METHODS

TECHNICAL FIELD

Embodiments relate generally to inductive communication circuits, systems, and methods.

BACKGROUND

In a variety of applications, electrical (or galvanic) isolation is desired between distinct circuits while enabling communication between those circuits. "Galvanic isolation" means that there is no metallic or highly conductive path between the distinct circuits. For example, galvanic isolation may be desired to protect a first circuit that operates at a relatively low supply voltage from a second circuit that operates at a relatively high supply voltage difference from the first circuit. In addition, galvanic isolation may be desired to isolate a first circuit tied to a first voltage reference (e.g., ground) from a second circuit tied to a different voltage reference (e.g., a floating voltage reference). Galvanic isolation also may be desired to prevent extraneous transient signals produced by a first circuit from being conveyed to and processed by another circuit as valid signals or data.

A specific application that may benefit from galvanic isolation may be found within an automotive hybrid electric vehicle (HEV) system, for example. In an HEV system, a circuit that includes an insulated gate bipolar transistor (IGBT) array and corresponding gate drivers (referred to as an "IGBT circuit") may be used to rectify AC power, and to provide the resulting DC power to a high voltage battery (e.g., 300 volts (V) or more). A grounded control circuit (e.g., including a microcontroller) operating at a significantly lower vehicle chassis voltage (e.g., 12 V) may be used to provide control signals to the gate drivers. In order to isolate the control circuit from switching noise from the IGBT circuit, it may be desirable to provide complete galvanic isolation between the control circuit and the IGBT circuit.

In other systems, for safety reasons, it may be desirable to isolate equipment that is connected to an AC power line from conductive portions of the equipment that users can touch. In such systems, an isolation circuit may be used to mitigate the likelihood of shocks, burns, and/or electrocution from current flowing through a human body to ground.

Conventional techniques for providing electrical isolation include the use of optical isolators, capacitive isolators, transformer-based isolators, and so on. However, these techniques may be non-optimal or unsuitable for some applications, in that they may be expensive, require a large amount of space, consume significant power, and/or have some other characteristics that may reduce their desirability for a given application.

DETAILED DESCRIPTION

In a transformer based system (e.g., a galvanic isolation system), common mode (CM) noise may couple via parasitic capacitance between the primary and secondary coils of the transformer into the transmit and receive sections of the circuit. For example, in an inductive communication system that implements galvanic isolation between transmit and receive coils, the CM noise signal may overwhelm a desired signal, thereby reducing the effective use of the communication link. In some cases, the CM noise signal can be large enough to disable the transmit and/or the receive sections of the communication link. As will be described in more detail below, embodiments described herein include systems that include isolated coils and capacitive structures configured to suppress CM noise that occurs due to the parasitic capacitance inherent in the isolated coil structure. Although the various embodiments are discussed specifically with respect to an inductive communication system that implements galvanic isolation, other embodiments may be implemented in other types of transformer based systems or systems that include isolated coils.

A typical inductive communication system that implements galvanic isolation includes: 1) a transmitter section that converts an input signal to another signal that can be inductively communicated over a galvanic barrier; and 2) a receiver section that can receive the inductively communicated signal, convert the received signal back into an approximation of the input signal, and output the resulting signal. Desirably, the receiver section is configured to reject unwanted noise such as a CM noise signal. According to various embodiments, rejection of unwanted noise (e.g., CM noise) is achieved by adding capacitance (referred to herein as "CM noise suppression capacitance") to the inductive communication system between each coil and its respective ground. In this way, CM signals that may appear across the primary and secondary coils is voltage divided by the ratio of the parasitic capacitance across the coils to the CM noise suppression capacitance. For example, according to various embodiments, the CM noise suppression capacitance may include one or more discrete capacitors coupled between each coil and a ground reference, or may include capacitive structures that include the coils. In either embodiment, the resulting circuit may reduce the impact of CM noise on the transmit and receive sections, allowing for an improved transient noise immunity.

According to an embodiment, an inductive communication device includes at least two integrated circuit (IC) die, each of which includes at least one conductive coil. The conductive coil associated with a transmitter section and the conductive coil associated with a receiver section are aligned with each other across a gap. One or more dielectric components may be positioned within the gap, where the dielectric component(s) have properties that provide a desired level of galvanic isolation between the coils. According to an embodiment, the IC die also may include communication circuitry (e.g., transmitter, receiver, and/or transceiver circuitry) coupled to the coils, where the communication circuitry converts input signals into communication signals that are conducive to inductive communication, and after the communication signals have been inductively communicated, converts the communication signals into an approximation of the input signals. According to an embodiment, the first and second IC die and the intervening dielectric component(s) all are packaged within a single integrated circuit package.

Figure 1:
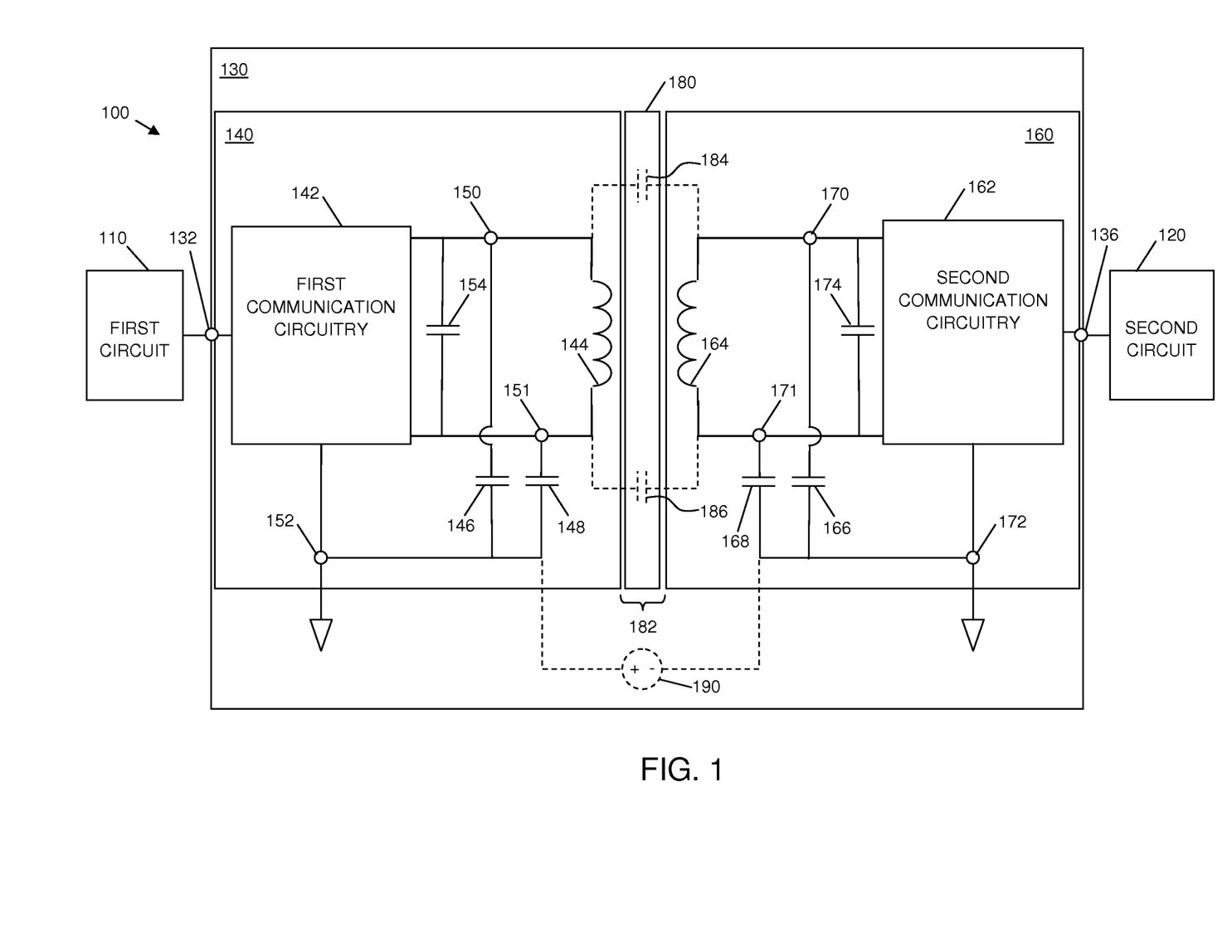
FIG. 1 is a simplified, circuit diagram illustrating a system that includes an inductive communication device that provides galvanic isolation between first and second circuits, according to an example embodiment.

FIG. 1 is a simplified, circuit diagram illustrating a system 100 that includes an inductive communication device 130 that provides galvanic isolation between first and second circuits 110, 120, according to an example embodiment. Accordingly, inductive communication device 130 alternatively may be referred to as a "galvanic isolation device." In system 100, the first circuit 110 may operate at a relatively low supply voltage, and the second circuit 120 may operate at a voltage difference from circuit 110, although circuits 110, 120 may operate without a voltage difference, as well. In addition or alternatively, the first circuit 110 may be tied to a first voltage reference point (e.g., ground) and the second circuit 200 may tied to a different voltage reference point (e.g., a floating voltage level), although circuits 110, 120 may be tied to the same voltage reference point, as well. System 100 may, for example, form a portion of a battery charging system for an HEV (e.g., the first circuit 110 may include a control circuit, and the second circuit 120 may include an array of IGBTs and associated gate drivers), a portion of an AC power isolation system, or may form a portion of another type of system in which galvanic isolation between first and second circuits is desired.

The various components of inductive communication device 130 are packaged in a single package (e.g., an air-cavity package or overmolded package), in an embodiment. These components include a first integrated circuit (IC) die 140, a second IC die 160, and one or more dielectric components (including dielectric structure 180) positioned between the first and second IC die 140, 160. As used herein, a "dielectric component" may be an air gap or a physical structure that includes dielectric material (e.g., a layer of dielectric material or another type of structure that includes dielectric material). As will be better illustrated in the Figures that follow, the first and second IC die 140, 160 are physically arranged with respect to each other to provide inductive communication between the first and second IC die 140, 160 across a gap 182, which includes the dielectric structure 180. In some embodiments, the dielectric structure 180 may substantially fill the gap 182 between the surfaces of the first and second IC die 140, 160. In other embodiments, one or more air gaps may be present within the gap 182 (i.e., the gap 182 may not be completely filled by the dielectric structure 180). In other embodiments, the dielectric structure 180 may be excluded altogether, and gap 182 may be maintained using other support structures (not illustrated).

According to some embodiments, and as depicted in FIG. 1, communication circuitry may be included within the same IC as its associated coil. For example, communication circuitry 142 and coil 144 are both included in first IC 140, and communication circuitry 162 and coil 164 are both included in second IC 160. In alternate embodiments, communication circuitry may be formed on a separate IC from its associated coil. In such embodiments, the IC that includes the coil and the IC that includes the corresponding communication circuitry may both be included within a single packaged device, or may be in distinctly packaged devices.

In the embodiment depicted in FIG. 1, the inductive communication device 130 may support one-way or bi-directional communication between the circuits 110, 120. More specifically, the communication path between the first circuit 110 and the second circuit 120 includes first communication circuitry 142 and a first coil 144 within the first IC die 140, and a second coil 164 and second communication circuitry 162 within the second IC die 160. More specifically, the first communication circuitry 142 is coupled through nodes 150, 151 to the two terminals of first coil 144, and the second communication circuitry 162 is coupled through nodes 170, 171 to the two terminals of second coil 164. The first communication circuitry 142 may include transmitter circuitry, receiver circuitry, or transceiver circuitry. Similarly, the second communication circuitry 162 may include receiver circuitry, transmitter circuitry, or transceiver circuitry. Although inductive communication device 130 is shown to provide one communication path, other embodiments of inductive communication devices may provide multiple one-way or bi-directional communication paths.

An example of one-way communication from first circuit 110 to second circuit 120 will now be described to more fully explain operation of system 100. It should be understood that communication in the reverse order could be similarly achieved, or bi-directional communication between the first and second circuits 110, 120 could be achieved using a time duplexed protocol. Proceeding with the one-way communication example, during operation, communication circuitry 142 receives an input signal from first circuit 110 via input node 132. Communication circuitry 142 then converts the input signal into a form that is appropriate for inductive communication by coil 144. More specifically, in an embodiment, communication circuitry 142 provides a time-varying (e.g., oscillating) drive signal (e.g., an alternating current in the form of a sinusoidal wave, a square wave, or another wave pattern) to coil 144. Coil 144 converts the drive signal into a time-varying magnetic field or flux around coil 144, referred to herein as the "communication signal." The time-varying magnetic field or flux generated by coil 144 extends across gap 182 through the dielectric structure 180 (and other dielectric components, if they are present within the gap 182) and couples with coil 164. More specifically, the communication signal is transmitted from coil 144 to coil 164 through magnetic inductive coupling between the coil pair. In response to the communication signal coupling with coil 164, coil 164 produces an alternating signal, waveform or voltage, which is received by communication circuitry 162. Communication circuitry 162 then converts the signal received from coil 164 into a reconstructed or approximate version of the input signal, and the reconstructed version of the input signal is provided at output node 136 to the second circuit 120.

First communication circuitry 142 is coupled between first circuit 110 and coil 144, and second communication circuitry 162 is coupled between second circuit 120 and coil 164, in an embodiment. According to an embodiment, when capable of functioning as transmitter circuitry, each instance of communication circuitry 142, 162 includes an oscillator (not illustrated) and driver circuit (not illustrated) configured to provide the time-varying drive signal to the coil 144, 164 to which it is coupled. For example, the driver circuit within communication circuitry 142 may receive an input signal from first circuit 110 (e.g., an information-carrying square wave), and may convert the input signal into an alternating signal having characteristics that are conducive to inductive communication between the primary/secondary coil pairs. According to an embodiment, for example, the driver circuit may implement amplitude-shift keying (ASK) modulation to represent the digital data conveyed in an input signal. More specifically, for example, the driver circuit may implement on-off keying (OOK), in which the driver circuit produces a carrier wave at a frequency established by the oscillator when the input signal has a relatively high logic level (e.g., indicating a binary one), and refrains from producing the carrier wave when the input signal has a relatively low logic level (e.g., indicating a binary zero). In alternate embodiments, the driver circuit may implement other modulation techniques (e.g., frequency modulation, phase modulation or other techniques). According to an embodiment, the carrier wave conveyed within the drive signal may have a frequency in a band of between about 200 megahertz (MHz) and about 400 MHz (e.g., 300 MHz), although the carrier wave may have higher or lower frequencies in other bands, as well. According to an embodiment, when capable of functioning as receiver circuitry, each instance of communication circuitry 142, 162 includes an amplifier, a detector (not illustrated) and other circuitry configured to convert the time-varying communication signal received from the coil 144, 164 to which it is coupled into a reconstructed version of the signal that was input into the transmitting instance of communication circuitry 142, 162 along the communication path.

The dielectric structure 180 (and other dielectric components, if present within the gap 182) provides DC isolation (galvanic isolation) between the first IC die 140 and the second IC die 160, and thus between the first circuit 110 and the second circuit 120. The level of DC isolation provided is affected by the cumulative thickness of the dielectric structure 180 and any other dielectric components within the gap 182 (or the width of the gap 182 that is established by the dielectric structure 180 and other dielectric components, if present) and the dielectric strength(s) of the dielectric structure 180 and any other dielectric components within the gap 182. For example, the dielectric structure 180 and other dielectric components, if present, may be configured to provide DC isolation in a range of about 1.0 kilovolts (kV) to about 4.0 kV, or more desirably from about 2.0 kV to about 5.0 kV, although dielectric structure 180 and other dielectric components, if present, may be configured to provide more or less DC isolation, as well.

During operation of system 100, the voltage potential of the transmitting coil (i.e., whichever one of coils 144, 164 is being used as the primary coil at the time) may vary rapidly. Due to the inherent parasitic capacitance between the coils 144, 164 (indicated in FIG. 1 with capacitors 184, 186, depicted using dashed lines as they are not actual discrete components) and the high frequency content associated with the rapid voltage fluctuations, a substantial amount of power may be communicated through the parasitic capacitance, resulting in a significant CM noise signal in the receiving IC (i.e., whichever of ICs 140, 160 is functioning as a receiver at the time). In FIG. 1, voltage source 190 represents the CM noise signal, and is depicted using dashed lines as it is not an actual component of the system 100.

According to an embodiment, each of the first and second IC die 140, 160 also includes one or more CM noise reduction capacitors 146, 148, 166, 168 coupled between each coil 144, 164 and the respective voltage reference of each IC die 140, 160. The CM noise reduction capacitors 146, 148, 166, 168 are configured to suppress the CM noise associated with the inherent parasitic capacitance between the coils 144, 164 (i.e., the capacitance represented by capacitors 184, 186). More specifically, the voltage, $V_I$, at each node 150, 151, 170, 171 due to the CM noise signal, $V_{CM}$, is reduced according to the following equation:

$$V_I = V_{CM} * C_P / (2*(C_P + C_C)),$$

where $C_P$ represents the capacitance value of the parasitic capacitance represented by capacitors 184, 186, and $C_C$ represents the capacitance value of the CM noise reduction capacitor 146, 148, 166, 168 coupled to the node 150, 151, 170, 171. When the capacitance value, $C_C$, of the CM noise reduction capacitors 146, 148, 166, 168 are large in comparison to the parasitic capacitance, $C_P$ (i.e., $C_C \gg C_P$), the voltage, $V_I$, at each node 150, 151, 170, 171 due to the CM noise signal, $V_{CM}$, may be approximated as $V_{CM} * C_P / C_C$. Accordingly, the effect of the CM noise signal can be reduced on the communication circuitry 142, 162 by roughly $C_P/C_C$.

According to an embodiment, the capacitance value for each CM noise reduction capacitor 146, 148, 166, 168 is in a range of 1 to 20 times the capacitance value of the parasitic capacitance (represented by capacitors 184, 186). For example, in a system in which the parasitic capacitance is in a range of about 10 femtofarad (fF) to about 50 fF, the capacitance values of CM noise reduction capacitors 146, 148, 166, 168 may be in a range of about 10 fF to about 1000 fF. In alternate embodiments, the capacitance value of some or all of the CM noise reduction capacitors 146, 148, 166, 168 may be greater than 20 times the parasitic capacitance. According to an embodiment, the capacitance values of CM noise reduction capacitors 146, 148 are substantially equal, and the capacitance values of CM noise reduction capacitors 166, 168 are substantially equal, although the capacitance values of the CM noise reduction capacitors 146, 148 of first IC 140 may (or may not) be different from the capacitance values of the CM noise reduction capacitors 166, 168 of second IC 160.

According to an embodiment, the CM noise reduction capacitors 146, 148, 166, 168 may be implemented using discrete components or integrated capacitors that are distinct from (i.e., don't include any portions of) coils 144, 164. For example, a first CM noise reduction capacitor 146 may be coupled between node 150 and a voltage reference node 152 for the first IC 140, and a second CM noise reduction capacitor 148 may be coupled between node 151 and the voltage reference node 152. Similarly, a third CM noise reduction capacitor 166 may be coupled between node 170 and a voltage reference node 172 for the second IC 160, and a fourth CM noise reduction capacitor 168 may be coupled between node 171 and the voltage reference node 172. As indicated previously, the voltage references for the first and second IC die 140, 160 may be the same or different (e.g., ground and/or some other voltage reference(s)).

In alternate embodiments, the capacitance represented by CM noise reduction capacitors 146, 148, 166, 168 may be implemented using capacitive structures that include portions of coils 144, 164 as part of each capacitive structure (e.g., as a top electrode of each capacitive structure). Such a capacitive structure may be referred to herein as a "coil-including capacitor" or "coil-including capacitance." Examples of such embodiments will be described in more detail in conjunction with FIGS. 2-4.

According to an embodiment, the first and second IC die 140, 160 also may include tuning capacitors 154, 174 having the same or different capacitance values, $C_A$, coupled between nodes 150, 151 and 170, 171, respectively. The tuning capacitors 154, 174 are configured to enhance the resonance between coils 144, 164. In an alternate embodiment, tuning capacitors 154, 174 may be excluded. In an embodiment in which tuning capacitors 154, 174 are excluded, the capacitance value, $C_C$, of the CM noise reduction capacitors 146, 148, 166, 168 is limited to $2*C_A$. This comes about because the CM noise reduction capacitors 146, 148, 166, 168 displace the tuning capacitors 154, 174 to keep the total differential capacitance constant.

Figure 2:
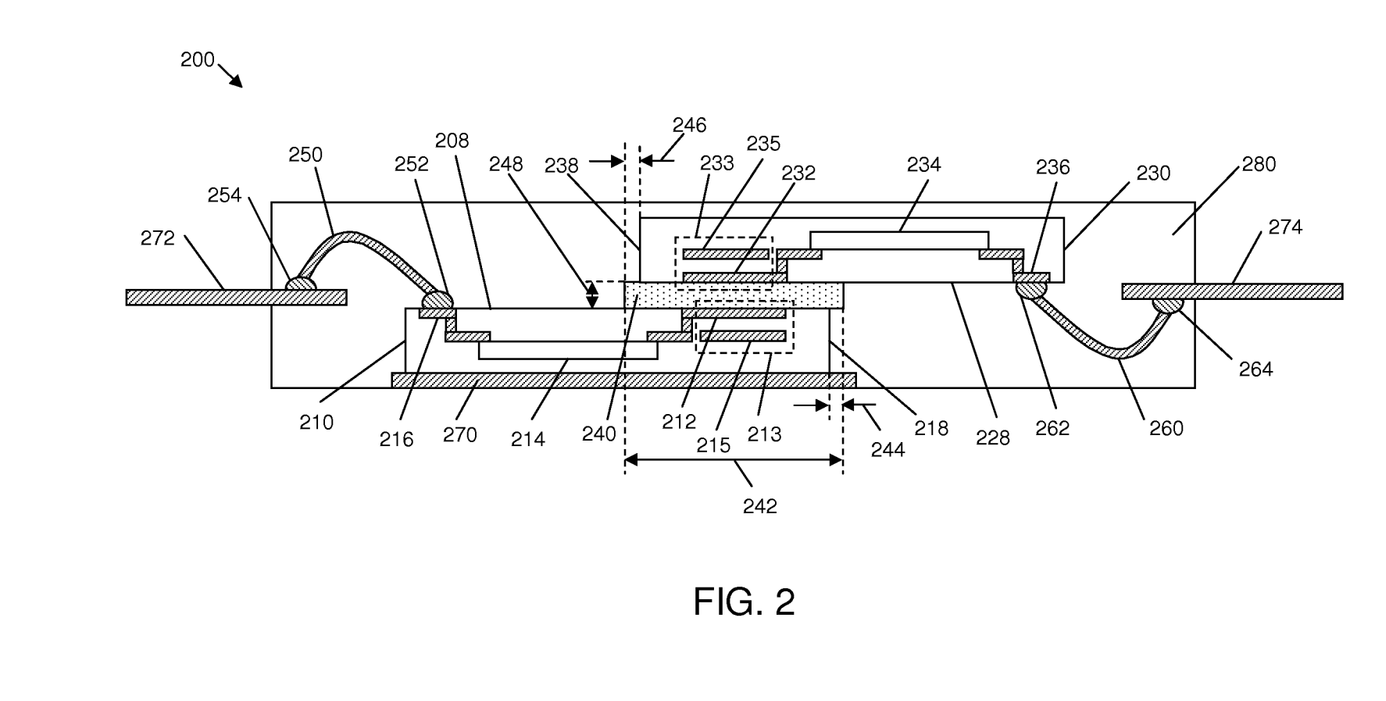
FIG. 2 is a cross-sectional, side view of an inductive communication device, according to an example embodiment.

An example embodiment of an inductive communication device (e.g., device 130) and a configuration of IC die and interposed dielectric structures (e.g., configurations of IC die 140, 160 and dielectric structure 180) will now be described in more detail. For example, FIG. 2 is a cross-sectional, side view of an inductive communication device 200 (e.g., inductive communication device 130, FIG. 1), according to an example embodiment. Inductive communication device 200 includes a first IC die 210, a second IC die 230, a dielectric structure 240 positioned between the first and second IC die 210, 230, a plurality of leads 272, 274, and a plurality of wirebonds 250, 260, in an embodiment. In addition, inductive communication device 200 may include a support structure 270 and encapsulation 280. More particularly, in the embodiment depicted in FIG. 2, the electrical components of inductive communication device 200 of FIG. 2 are housed in an overmolded package (i.e., a package in which the electrical components are substantially encased in a non-conductive (e.g., plastic) encapsulant material). As mentioned previously, embodiments of inductive communication devices alternatively may include electrical components housed in an air-cavity package (i.e., a package in which the electrical components are located within an air cavity within the package, where the air cavity is typically sealed with a lid).

First IC die 210 includes at least one coil 212 (e.g., coil 144, FIG. 1), at least one CM noise reduction capacitor 213 (e.g., CM noise reduction capacitor 146 and/or 148), at least one instantiation of communication circuitry 214 (e.g., communication circuitry 142, FIG. 1), a plurality of bond pads 216, and various conductive traces and vias interconnecting the coil(s) 212, communication circuitry 214, and bond pads 216. In an alternate embodiment, as mentioned previously, the communication circuitry 214 may be included in a separate die within the same package as the die that contains the coil 212 and CM noise reduction capacitor(s) 213, or the communication circuitry 214 may be separately packaged. In any of the above-described embodiments, the bond pads 216 may be considered to be electrically coupled to the coil 212 (e.g., either directly or indirectly through communication circuitry 214).

Similarly, second IC die 230 includes at least one coil 232 (e.g., coil 164, FIG. 1), at least one CM noise reduction capacitor 233 (e.g., CM noise reduction capacitor 166 and/or 168), at least one instantiation of communication circuitry 234 (e.g., communication circuitry 162, FIG. 1), a plurality of bond pads 236, and various conductive traces and vias interconnecting the coil(s) 232, communication circuitry 234, and bond pads 236. As was the case with the first IC die 210, in an alternate embodiment, the communication circuitry 234 may be included in a separate die within the same package as the die that contains the coil 232 and CM noise reduction capacitor(s) 233, or the communication circuitry 234 may be separately packaged. In whichever embodiment, the bond pads 236 may be considered to be electrically coupled to the coil 232 (e.g., either directly or indirectly through communication circuitry 234).

One of coils 212, 232 may function as a primary coil, and the other of coils 212, 232 may function as a secondary coil, or both coils 212, 232 may function as a primary and a secondary coil at alternating times (e.g., in a transceiver-type embodiment). Either way, coils 212, 232 each are proximate to an exterior surface 208, 228 of the IC die 210, 230 in which they are included. As used herein, the term "proximate to an exterior surface," when referring to the position of a coil means that a portion of the coil is either exposed at the surface, or that one or more non-conductive layers of material (e.g., oxide layers) is disposed over the coil, where the surface of the non-conductive layers of material establishes the surface of the IC.

According to an embodiment, each CM noise reduction capacitor 213 within the first IC die 210 includes a first electrode formed from a portion of coil 212, and a second electrode formed from an electrode structure 215 proximate to coil 212. The first and second electrodes are electrically isolated with dielectric material between the coil 212 and the electrode structure 215. Similarly, each CM noise reduction capacitor 233 within the second IC die 230 includes a first electrode formed from a portion of coil 212, and a second electrode formed from an electrode structure 215 proximate to coil 212. Again, the first and second electrodes are electrically isolated with dielectric material between the coil 232 and the electrode structure 235.

As will be described in more detail in conjunction with FIG. 3 later, each IC die 210, 230 may include an IC substrate (e.g., IC substrate 302, FIG. 3) within which the communication circuitry 214, 234 is formed, and a plurality of alternating conductive and dielectric layers formed over a surface of the substrate (e.g., conductive and dielectric layers 310, FIG. 3). According to an embodiment, the coils 212, 232 and electrode structures 215, 235 that provide the electrodes for the CM noise reduction capacitors 213, 233 each are formed from portions of one or more of the conductive layers overlying the IC substrate. For example, each of the coils 212, 232 may be formed within a first set of one or more of the conductive layers, and each of the electrode structures 215, 235 may be formed within a second set of one or more of the conductive layers. The first and second sets of conductive layers may have one or more common layers, or may not include any common layers. In the embodiment illustrated in FIG. 2, for example, each of the coils 212, 232 (or first electrodes of the CM noise reduction capacitors 213, 233) is shown to include a portion of a conductive layer that is closest to the exterior surfaces 208, 228 of the IC die 210, 230, and each of the electrode structures 215, 235 (or second electrodes of the CM noise reduction capacitors 213, 233) is shown to include a portion of a conductive layer that is between the coil 212, 232 and the IC substrate. In alternate embodiments, electrode structure 215 may include a portion of a conductive layer that is between the coil 212 and the exterior surface 208, and/or electrode structure 235 may include a portion of a conductive layer that is between the coil 232 and the exterior surface 228. Accordingly, coil 212 may include a portion of a conductive layer that is between the electrode structure 215 and the IC substrate, and/or coil 232 may include a portion of a conductive layer that is between the electrode structure 235 and the IC substrate.

The coils 212, 232 are electrically coupled to the communication circuitry 214, 234, as shown in FIG. 2. Conversely, although not shown in FIG. 2, the electrode structures 215, 235 are electrically coupled to voltage references (e.g., ground, a floating voltage reference, or another voltage reference) of their respective IC die 210, 230. Accordingly, each CM noise reduction capacitor 213, 233 is electrically coupled between the communication circuitry 214, 234 and the voltage reference for the IC die 210, 230. In some cases, the voltage reference for the IC die 210, 230 may be accessed through one of the bond pads 216, 236 (e.g., the electrode structures 215, 235 may be electrically coupled to the bond pads 216, 236).

In any event, the surfaces 208, 228 of the first and second IC die 210, 230 to which the coils 212, 232 are proximate are arranged to face each other within device 200 so that the coils 212, 232 are aligned with each other across a gap that is established by the dielectric structure 240. The alignment of the coils 212, 232 across the gap enables inductive communication to occur between the coils 212, 232.

Dielectric structure 240 is positioned within the gap directly between the coils 212, 232, and may extend laterally beyond the coils 212, 232. According to an embodiment, a thickness 248 of the dielectric structure 240 substantially equals the width of the gap between the coils 212, 232. Accordingly, the level of galvanic isolation between the coils 212, 232 (and thus the IC die 210, 230) is directly related to the thickness 248 of the dielectric structure 240 and the material(s) from which the dielectric structure 240 is formed. In other embodiments, other dielectric components may be present within the gap between the coils 212, 232, as well. According to an embodiment, dielectric structure 240 may have a thickness 248 in a range of about 25 micrometers (um) to about 400 um, or more desirably from about 100 um to about 200 um, although dielectric structure 240 may be thinner or thicker, as well. According to a further embodiment, the dielectric structure 240 has a width 242, which is sufficient to allow the dielectric structure 240 to extend beyond the overlapping edges 218, 238 of the first and second IC die 210, 230 by a given distance 244, 246. This extension of the dielectric structure 240 beyond the overlapping edges 218, 238 of the IC die 210, 230 may result in a reduction in fringing effects that may be present near the overlapping edges 218, 238.

Dielectric structure 240 may have a dielectric constant in a range of about 2.0 to about 5.0, although dielectric structure 240 may have a lower or higher dielectric constant, as well. According to an embodiment, dielectric structure 240 includes a material selected from polyimide, polytetrafluoroethylene, benzocyclobutene, or other materials with a suitable dielectric constant and strength. According to a particular embodiment, dielectric structure 240 has adhesive top and/or bottom sides (e.g., dielectric structure 240 may be configured as a tape made from one of the aforementioned materials). Dielectric structure 240 may be formed from a single layer of material, or dielectric structure 240 may be formed from multiple layers of a single material or multiple materials, in various embodiments.

Support structure 270 and leads 272, 274 may form portions of a leadframe, in an embodiment. In the illustrated embodiment, the support structure 270 and leads 272, 274 are not co-planar. Accordingly, the support structure 270 essentially coincides with a bottom surface of device 200, and leads 272, 274 extend from the sides of device 200 at locations that are between the bottom and top surfaces of the device 200. In alternate embodiments, the support structure 270 and leads 272, 274 may be co-planar. In such embodiments, the leads either may extend outward from the bottom of the device 200, or the leads may terminate at the sides of the device 200 (e.g., in flat no-leads types of packages).

In the embodiment illustrated in FIG. 2, the first IC die 210 is coupled to support structure 270, the dielectric structure 240 is positioned on surface 208 of the first IC die 210, and surface 228 of the second IC die 230 is coupled to a top surface of dielectric structure 240. Portions of the surfaces 208, 228 of the first and second IC die 210, 230 overlap each other to allow the coils 212, 232 to be aligned with each other. The bond pads 216 of the first IC die 210 are coupled to leads 272 extending from a first side of the device 200 via wirebonds 250. More particularly, a first end 252 of each wirebond 250 is coupled to a bond pad 216 of first IC die 210, and a second end 254 of each wirebond 250 is coupled to a lead 272. Similarly, the bond pads 236 of the second IC die 230 are coupled to leads 274 extending from a second side of the device 200 via wirebonds 260. More particularly, a first end 262 of each wirebond 260 is coupled to a bond pad 236 of second IC die 230, and a second end 264 of each wirebond 260 is coupled to a lead 274. Leads 272, 274 may correspond to input and/or output nodes (e.g., leads 272, 274 may correspond to nodes 132, 136, FIG. 1). Although wirebonds 250, 260 are shown to be coupled to top and bottom surfaces, respectively, of leads 272, 274, the wirebonds 250, 260 may be coupled to different surfaces from those depicted in FIG. 2, in other embodiments.

Although a particular arrangement of IC die 210, 230, dielectric structure 240, leads 272, 274, and wirebonds 250, 260 is depicted in FIG. 2, the illustrated arrangement is not meant to be limiting. More specifically, embodiments of the inventive subject matter may be implemented in inductive communication devices or other transformer-based devices that are differently configured from device 200. For example, in other embodiments, either or both of the IC die 210, 230 may be electrically connected to the package leads 272, 274 through one or more additional IC die. For example, an additional IC die or PCB-like structure (referred to generically as an "additional device") may be coupled to the support structure 270 next to the first IC die 210, and the additional device may have a first set of bond pads or traces proximate to its top surface that are directly electrically coupled to the bond pads 236 of the second IC die 230. The additional device also may include a second set of bond pads proximate to its top surface that are electrically connected to package leads 274 (e.g., using wirebonds). In this manner, the device may be more easily manufacturable in that the wirebonds connected to package leads 274 may be made in the same orientation as the wirebonds 250 connected to package leads 272. In another alternate embodiment, the additional device may inductively communicate with the second IC die, as well (e.g., the additional device may have a structure similar to the first IC die 210). In such an embodiment, the second IC die 230 may include one or more additional coil(s) for inductively communicating with the additional device, and bond pads of the additional device may be electrically coupled to the package leads 274 (e.g., using wirebonds).

In still another alternate embodiment, the second IC die 230 may include through substrate vias (TSVs) that electrically couple the coil 232, electrode structure 235, communication circuitry 234, or other components to the top surface (as oriented in FIG. 2) of the second IC die 230 to additional bond pads proximate to that top surface. In such an embodiment, the bond pads may be electrically coupled to package leads 274 (e.g., through wirebonds). In still another alternate embodiment, the first and second IC die 210, 230 and the dielectric structure 240 may be sized and stacked so that conductive traces or other conductive structures may be placed on the top surface (as oriented in FIG. 2) of dielectric structure 240, and those conductive traces or structures may provide for electrical connection between bond pads 236 of the second IC die 230 and additional electrical connections (e.g., wirebonds) between the conductive traces or structures and package leads 274. Embodiments of the inventive subject matter may be implemented in a wide variety of devices and systems with other configurations and components, as well.

The cross-sectional view illustrated in FIG. 2 depicts a single communication path between leads 272, 274. For example, the direction of the communication path may be from lead 272 to lead 274. In such a case, communication circuitry 214 of the first IC die 210 may be transmitter circuitry, and the coil 212 of the first IC die 210 may function as a primary coil. Conversely, communication circuitry 234 of the second IC die 230 may be receiver circuitry, and the coil 232 of the second IC die 230 may function as a secondary coil. Alternatively, the direction of the communication path may be from lead 274 to lead 272. In this case, communication circuitry 234 of the second IC die 230 may be transmitter circuitry, and the coil 232 of the second IC die 230 may function as a primary coil. Conversely, communication circuitry 214 of the first IC die 210 may be receiver circuitry, and the coil 212 of the first IC die 210 may function as a secondary coil. Alternatively, communication circuitry 214, 234 may be transceiver circuitry, which may function as both transmitter circuitry and receiver circuitry in a time-duplexed manner. In such an embodiment, each of coils 212, 232 may alternate between functioning as a primary coil and a secondary coil. Although only a single communication path is depicted in FIG. 2, inductive communication device 200 also may include one or more additional communication paths in the same direction and/or the opposite direction.

A more detailed example of an embodiment of an IC die (e.g., IC die 210 and/or 230) will now be described. More particularly, FIG. 3 is a cross-sectional, side view of an IC die 300 that may be used in an inductive communication device (e.g., inductive communication device 130 or 200, FIGS. 1, 2), according to an example embodiment. IC die 300 includes a semiconductor substrate 302, and a build-up structure 310 comprising a plurality of conductive layers 311, 312, 313, 314, 315 and dielectric layers 316, 317, 318, 319, 320 on a top surface of the semiconductor substrate 302. Various active components forming communication circuitry 330 are formed in the semiconductor substrate 302. For example, the communication circuitry 330 may be transmitter circuitry, receiver circuitry or transceiver circuitry, in various embodiments. The components of the communication circuitry 330 are interconnected through conductive traces formed in some or all of the conductive layers 311-315 and conductive vias formed between the conductive layers 311-315. At least one bond pad 350 may be formed in an uppermost conductive layer 315, and the bond pad 350 may be electrically coupled to the communication circuitry 330 through conductive vias formed through the dielectric layers 316-319 and conductive traces formed between the vias in the conductive layers 311-314. When IC die 300 is incorporated into an inductive communication device (e.g., device 130, 200, FIGS. 1, 2), a wire bond (e.g., wirebond 250 or 260, FIG. 2) may be coupled between the bond pad 350 and a device lead (e.g., lead 272 or 274, FIG. 2). For example, bond pad 350 may correspond to a bond pad configured to receive a communication signal from external circuitry or to provide a communication signal to external circuitry (e.g., to bond pad 216 or 236, FIG. 2, corresponding to one of nodes 132 or 136, FIG. 1).

In addition, IC die 300 includes a coil 340 (e.g., one of coils 144, 164, 212, 232, FIGS. 1, 2), which includes multiple substantially-concentric conductive rings 341, 342, 343 formed in one or more uppermost conductive layers 313-315 (i.e., formed proximate to the top surface 304 of IC die 300). For example, in the embodiment illustrated in FIG. 3, coil 340 includes conductive rings formed in the uppermost three conductive layers 313-315. The conductive rings in the various layers 313-315 are interconnected through conductive vias 344, 345 to form a continuous conductive coil having a first and second ends that are electrically coupled to the communication circuitry 330. For example, a first end of the coil 340 may be coupled to the communication circuitry 330 through conductive via 346 and other conductive structures (not illustrated) between the coil 340 and the communication circuitry 330, and a second end of the coil 340 may be coupled to the communication circuitry 330 through conductive via 347 and still other conductive structures (not illustrated) between the coil 340 and the communication circuitry 330. In other embodiments, coil 340 may be formed using fewer or more than three conductive layers, and/or the ends of coil 340 may be located on a same conductive layer. In addition, the location of vias 344, 345 shown interconnecting the concentric conductive rings 341-343 may be located in other positions, and/or multiple vias may be used to provide a plurality of cross-overs used to construct the continuous coil 340.

As discussed above, all or portions of coil 340 may function as a first electrode of CM noise reduction capacitor 350. According to an embodiment, IC die 300 also includes an electrode structure 352 that functions as a second electrode of the CM noise reduction capacitor 350. The coil 340 and electrode structure 352 are electrically isolated by dielectric material, or more specifically a portion of dielectric layer 317 in FIG. 3. The electrode structure 352 may be coupled to the communication circuitry 330 through conductive via 354 and other conductive structures (not illustrated) between the electrode structure 352 and the communication circuitry 330. Alternatively, the electrode structure 352 may be coupled to a bond pad through one or more vias and other conductive structures.

The electrode structure 352 may be formed in a single conductive layer (e.g., layer 312), or the electrode structure 352 may be formed in multiple conductive layers. Further, all or portions of the electrode structure 352 may be formed in one or more conductive layers that are above the surface of the semiconductor substrate 302, or all or portions of the electrode structure 352 may be formed on the surface of the semiconductor substrate 302 (e.g., in the M1 layer, or conductive layer 311).

According to an embodiment, as is shown in FIG. 2, the electrode structure 352 is formed in a set of conductive layers that is below a second set of conductive layers within which the coil 340 is formed. In other words, the electrode structure 352 is physically located between the coil 340 and the surface of the semiconductor substrate 302 over which the build-up structure 310 is formed. In such an embodiment, the coil 340 and the electrode structure 352 do not include any portions that are formed within a common conductive layer. In an alternate embodiment, portions of the coil 340 and the electrode structure 352 may be formed within one or more common conductive layers.

The uppermost dielectric layer 320 may or may not overlie the coil 340, in various embodiments. In an embodiment in which the uppermost dielectric layer 320 does overlie the coil 340 (e.g., the embodiment illustrated in FIG. 3), the height of the portion of the uppermost dielectric layer 320 overlying the coil 340 contributes to the thickness of the gap (e.g., thickness 248, FIG. 2) between the IC die 300 and a second IC die (not illustrated in FIG. 3). In addition, the portion of the uppermost dielectric layer 320 overlying the coil 340 may contribute to the overall level of galvanic isolation between IC 300 and a second IC, when arranged according to the embodiments discussed herein.

Figure 4:
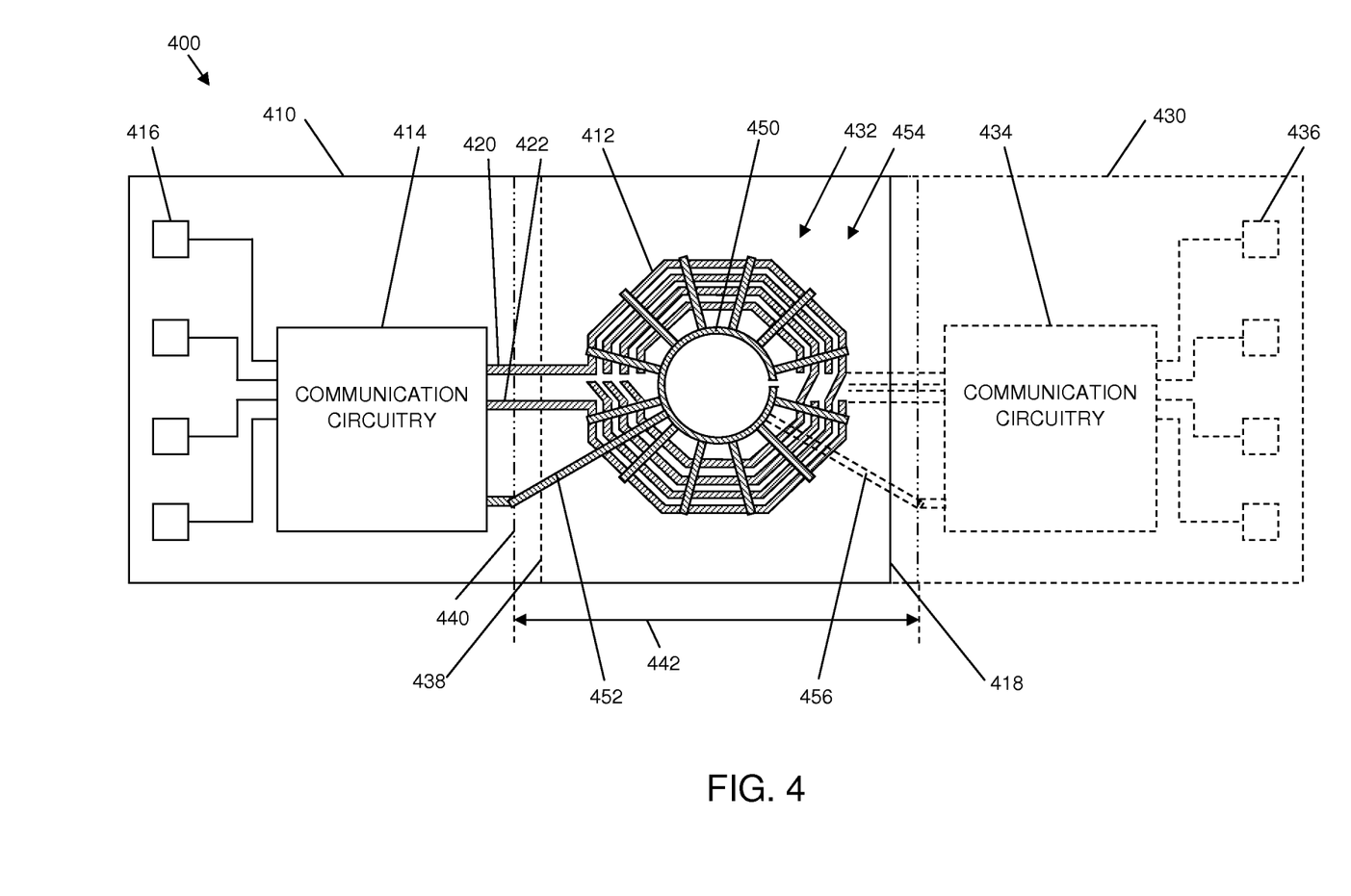
FIG. 4 is a bottom view of a portion of an inductive communication device, according to an example embodiment.

An embodiment of an arrangement of IC die within an inductive communication device will now be described in conjunction with FIG. 4. More particularly, FIG. 4 depicts an embodiment that includes a single communication path with a single primary/secondary coil pair. Other embodiments of inductive communication devices may include multiple parallel communication paths (each of which includes a single primary/secondary coil pair), or a single communication path that includes multiple primary/secondary coil pairs.

FIG. 4 is a bottom view of a portion of an inductive communication device 400 (e.g., inductive communication device 200, FIG. 2) with a single communication path that includes a single primary/secondary coil pair 412, 432, according to an example embodiment. More particularly, FIG. 4 illustrates the bottom surface of a first IC die 410 (e.g., the surface of IC die 210 that is coupled to support structure 270, FIG. 2), which includes a first coil 412 (e.g., coil 212, FIG. 2) proximate to an exterior surface of the first IC die 410 (e.g., surface 208, FIG. 2), first communication circuitry 414 (e.g., transmitter, receiver, or transceiver circuitry), and a plurality of first bond pads 416. In addition, first IC die 410 includes an electrode structure 450 (e.g., electrode structure 215, FIG. 2), which functions as a bottom electrode of a CM noise reduction capacitor (e.g., CM noise reduction capacitor 213, FIG. 2).

Coil 412 consists of a continuous conductive structure (i.e., continuous between a first terminal 420 and output second terminal 422, which may correspond to nodes 150, 151, FIG. 1, for example) that includes multiple substantially-concentric conductive rings that may be located in multiple conductive layers of the device 400. In FIG. 4, coil 412 does not appear to consist of a continuous conductive structure between first terminal 420 and second terminal 422, as there are various discontinuities shown within coil 412. The discontinuities are shown to simplify the depiction of coil 412, and also to indicate that the coil's concentric rings may be coupled through conductive vias to concentric rings in underlying conductive layers, further conveying that the structure of coil 412 may be a multi-layer structure that includes a plurality of cross-overs to establish a continuous conductive structure.

Figure 5:
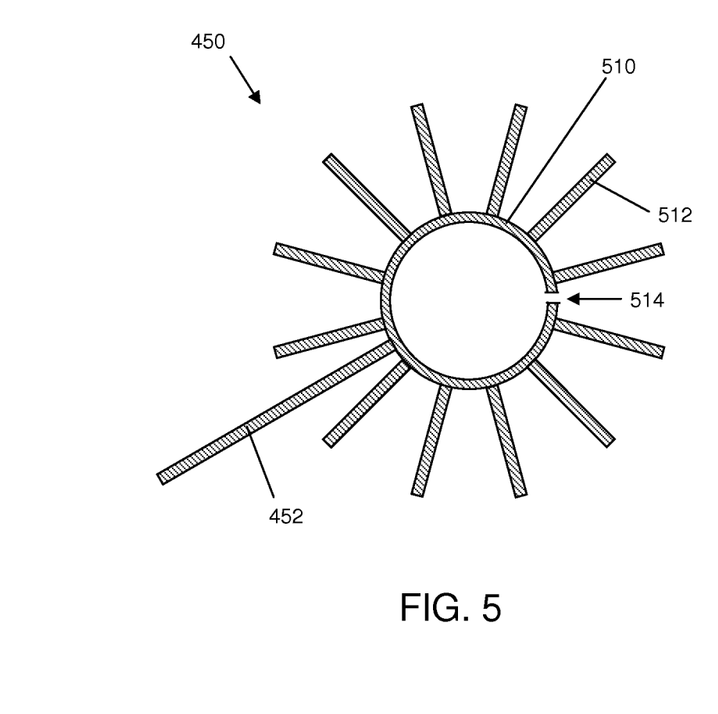
FIG. 5 is a top view of an electrode structure that may function as an electrode of a common mode noise reduction capacitor, according to an example embodiment.
Figure 7:
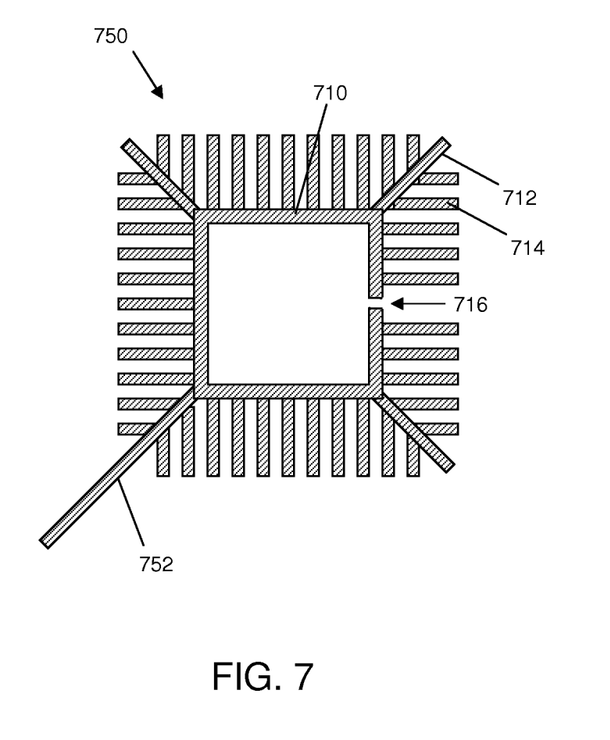
FIG. 7 is a top view of an electrode structure that may function as an electrode of a common mode noise reduction capacitor, according to yet another example embodiment.
Figure 8:
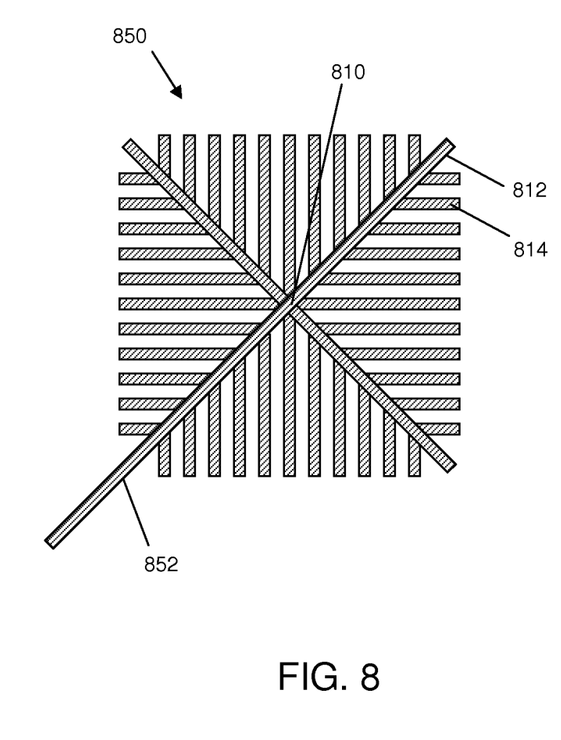
FIG. 8 is a top view of an electrode structure that may function as an electrode of a common mode noise reduction capacitor, according to yet another example embodiment.

Electrode structure 450 may have any of a wide variety of configurations, with only one such configuration being illustrated in FIG. 4. Referring also to FIG. 5 in which electrode structure 450 may be viewed more clearly, electrode structure 450 includes an inner ring 510 and a plurality of conductive fingers 512 extending outwardly from the ring 510. As can be seen clearly in FIG. 4, the conductive fingers 512 extend over at least a portion of coil 412 to ensure capacitive coupling between the coil 412 and the electrode structure 450. Although electrode structure 450 is shown to include twelve fingers 512, an electrode structure may include more or fewer fingers 512, as well. Further, the number, density, widths, and lengths of fingers 512 may be selected to achieve a desired capacitance. In addition, although electrode structure 450 is shown to include a substantially circular ring 510 and fingers 512 that extend outward to define a substantially circular footprint for the electrode structure 450, alternate embodiments may include a ring having a substantially square, rectangular, or other shape (e.g., as illustrated in FIG. 7), and/or the fingers may extend outward to define a substantially square, rectangular, or otherwise shaped footprint for the electrode structure (e.g., as illustrated in FIGS. 7 and 8).

Electrode structure 450 is electrically coupled to communication circuitry 414 (or to one of bond pads 416) through one or more traces (e.g., trace 452), vias (not shown), and/or other conductive structures (not shown). In this manner, electrode structure 450 may be coupled to a voltage reference for IC 410.

In an embodiment, a gap 514 is present in the ring 510 to render electrode structure 450 non-continuous or open. With a non-continuous or open structure, such as is depicted in FIG. 4, the generation of undesirable current may be avoided, which otherwise may result in magnetic fields. The ring-and-finger configuration of electrode structure 450 enables circuitry (e.g., all or portions of communication circuitry 414) easily to be positioned below the center of or otherwise within the footprint of coil 412, thus achieving a smaller overall device size.

Figure 6:
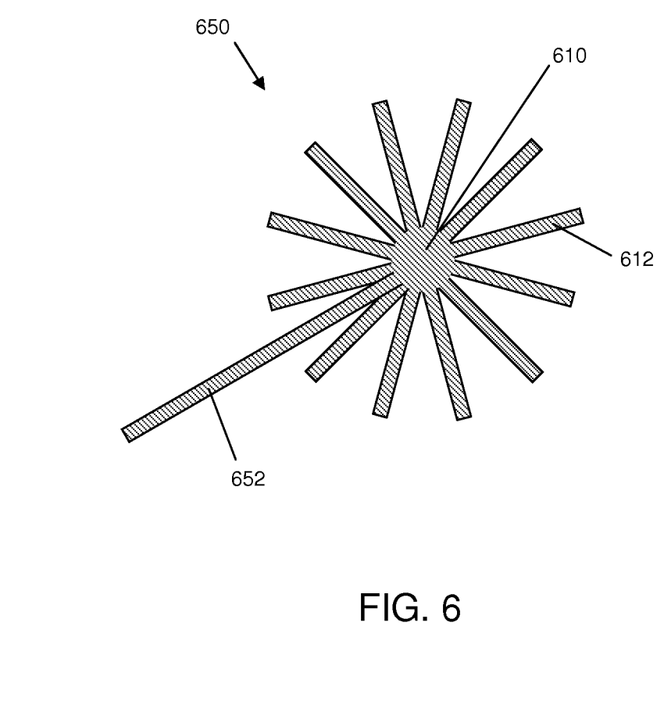
FIG. 6 is a top view of an electrode structure that may function as an electrode of a common mode noise reduction capacitor, according to another example embodiment.

Although electrode structure 450 includes an inner ring 510 and outwardly extending fingers 512, in an alternate embodiment, an electrode structure may include an outer ring and a plurality of conductive fingers extending inwardly from the ring over portions of coil 412. In still another alternate embodiment, an electrode structure may include a ring with conductive fingers extending both inwardly and outwardly from the ring over portions of coil 412. In still other alternate embodiments, the electrode structure may have a configuration other than a ring-and-finger configuration. For example, FIG. 6 is a top view of another embodiment of an electrode structure 650 that may function as an electrode of a CM noise reduction capacitor, where the electrode structure 650 has a hub-and-spoke configuration. More particularly, electrode structure 650 includes a conductive central hub 610 and a plurality of conductive fingers 612 extending outwardly from the central hub 610. When included within an IC die that also includes a coil, the conductive fingers 612 would extend out over the coil in a manner similar to that depicted in FIG. 4. Electrode structure 650 may be electrically coupled to communication circuitry (or to a bond pads) through one or more traces (e.g., trace 652), vias (not shown), and/or other conductive structures. In still other alternate embodiments, such as those illustrated in FIGS. 7 and 8, an electrode structure 750, 850 may include a ring 710 (with a gap 716) or a hub 810, respectively, from which one or more branches 712, 812 extend, where additional fingers 714, 814 may extend from the branches 712, 812 and/or the ring 710 or hub 810. Again, the electrode structures 750, 850 may be electrically coupled to communication circuitry (or to a bond pads) through one or more traces (e.g., traces 752, 852), vias (not shown), and/or other conductive structures. Although four specific configurations of electrode structures have been illustrated in FIGS. 5-8, many other electrode structure configurations may be implemented, in other embodiments. Desirably, an electrode structure implemented in conjunction with an embodiment will not have a structure that will result in undesirable or unacceptable levels of degradation of desired magnetic fields (e.g., certain closed loop or other structures).

Referring again to FIG. 4, also depicted are the edges of a second IC die 430 overlying and partially overlapping the first IC die 410. The second IC die 430 is depicted using dashed lines to imply transparency for the purpose of avoiding obscuring the view of the bottom surface of the first IC die 410. The second IC die 430 includes a second coil 432 (e.g., coil 232, FIG. 2, which is not specifically apparent as the second coil 432 is substantially aligned with and underlies the first coil 412), second communication circuitry 434 (e.g., communication circuitry 234, FIG. 2), and a second plurality of bond pads 436. In addition, second IC die 430 includes an electrode structure 454 (e.g., electrode structure 235, FIG. 2, which also is not specifically apparent as the electrode structure 454 is substantially aligned with and underlies the first electrode structure 450), which functions as a bottom electrode of a CM noise reduction capacitor (e.g., CM noise reduction capacitor 233, FIG. 2). The electrode structure 454 of the second IC die 430 is electrically coupled to communication circuitry 434 (or to one of bond pads 436) through one or more traces (e.g., trace 456), vias (not shown), and/or other conductive structures (not shown). In this manner, electrode structure 454 may be coupled to a voltage reference for IC 430.

Some of first and second bond pads 416, 436 may be used to receive voltage references (e.g., power and ground), and other ones of first and second bond pads 416, 436 may be used to receive input signals, convey output signals, receive control signals, or to convey other types of signals. Although each set of first and second bond pads 416, 436 is shown to include four bond pads 416, 436, each IC 410, 430 may include more or fewer bond pads.

Also depicted in FIG. 4 are the edges of a dielectric structure 440, where the dielectric structure 440 is depicted using dashed and dotted lines also to imply transparency for the purpose of avoiding obscuring the view of the surface of the first IC die 210. As discussed previously, when arranged to provide inductive communication between coils 412, 432 of the first and second IC die 410, 430, the exterior surfaces of the first and second IC die 410, 430 to which the coils 412, 432 are proximate are oriented to face each other. In addition, the coils 412, 432 are substantially aligned with each other across a gap (e.g., gap 182, FIG. 1), which is established at least in part by the dielectric structure 440. As shown, the dielectric structure 440 is arranged so that it is present across the entire area of overlap of the coils 412, 432. In addition, in an embodiment, the dielectric structure 440 may have a width 442 such that the dielectric structure 440 extends beyond overlapping edges 418, 438 of the first and second IC die 410, 430.

The embodiment depicted in FIG. 4 provides for a single one-way or bi-directional communication path. For example, when first communication circuitry 414 includes transmitter circuitry and second communication circuitry 434 includes receiver circuitry, a one-way communication path may be established from left to right in FIG. 4, or more specifically from first bond pads 416 through transmitter circuitry 414, first coil 412, second coil 432, receiver circuitry 434, and second bond pads 436. Conversely, when first communication circuitry 414 includes receiver circuitry and second communication circuitry 434 includes transmitter circuitry, a one-way communication path may be established from right to left in FIG. 4, or more specifically from second bond pads 436 through transmitter circuitry 434, second coil 432, first coil 412, receiver circuitry 414, and first bond pads 416. When first and second communication circuitry 414, 434 each include transceiver circuitry, a time-duplexed, bi-directional communication path may be established between the first and second bond pads 416, 436.

Each of the example embodiments illustrated in FIGS. 4-6 depict one communication path, where the communication path provides for inductive communication using one primary/secondary coil pair. Other embodiments may include multiple one-way communication paths in a particular direction (e.g., one IC die may include multiple instantiations of transmitter circuitry and corresponding primary coils and the other IC die may include the same number of instantiations of secondary coils and corresponding receiver circuitry). Still other embodiments may include multiple one-way communication paths in both directions (e.g., each IC die may include one or more instantiations of both transmitter and receiver circuitry and corresponding primary and secondary coils). Still other embodiments may include multiple bi-directional communication paths (e.g., each IC die may include multiple instantiations of transceiver circuitry and corresponding primary and secondary coils). Such embodiments are encompassed by the scope of the inventive subject matter.

In addition, in FIG. 4, coil 412 is depicted as four concentric, hexagonal conductive rings. In other embodiments, the conductive rings comprising a coil may have different shapes, and/or different numbers of concentric rings. In addition, as discussed previously, each coil may be formed using concentric rings within multiple conductive layers (e.g., as depicted in FIG. 3). In other embodiments, each coil may be formed using concentric rings within a different number of conductive layers from the embodiment depicted in FIG. 3.

Figure 3:
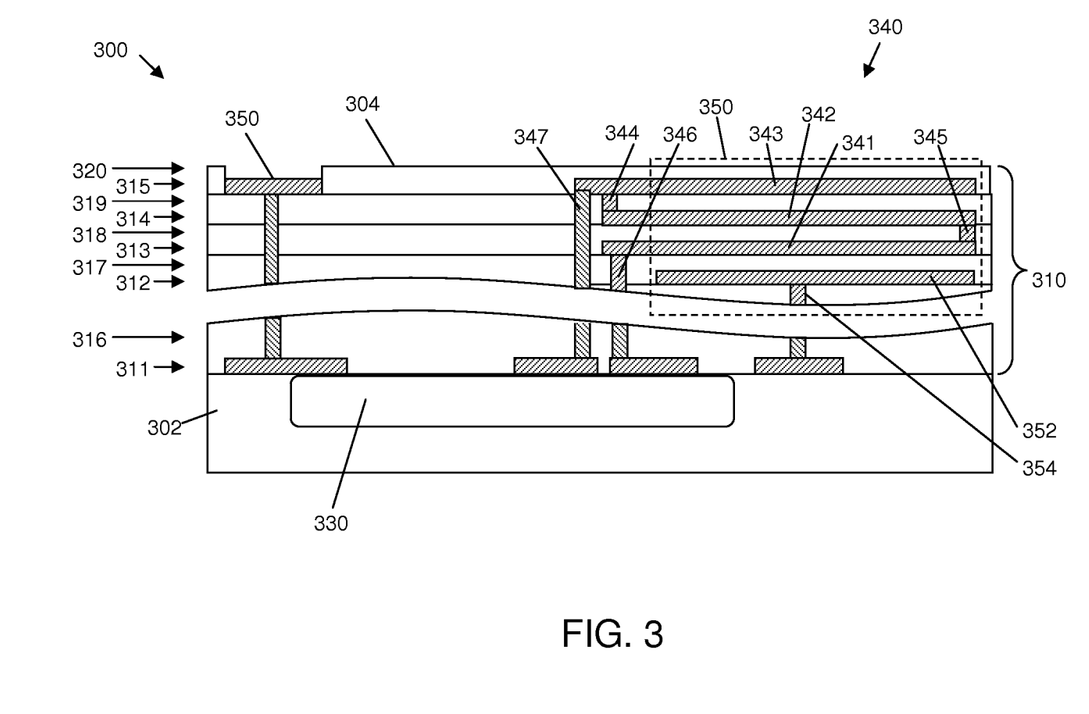
FIG. 3 is a cross-sectional, side view of an integrated circuit die that may be used in an inductive communication device, according to an example embodiment.

In the embodiments depicted in FIGS. 2-4, various relative orientations of coils, communication circuitry, and bond pads are conveyed. More particularly, in each of the embodiments depicted in FIGS. 2-4, the coils, communication circuitry, and bond pads are shown to be positioned in spatially separated portions of the respective IC die. It should be understood that, in alternate embodiments, the communication circuitry and bond pads of an IC die may be positioned in any suitable position with respect to the coil(s) of that IC die. For example, but not by way of limitation, all or portions of the communication circuitry may be positioned below the center of or otherwise within the footprint of a coil, as mentioned previously. Any suitable relative orientation of coils, communication circuitry, and bond pads is intended to be included within the scope of the inventive subject matter.

Figure 9:
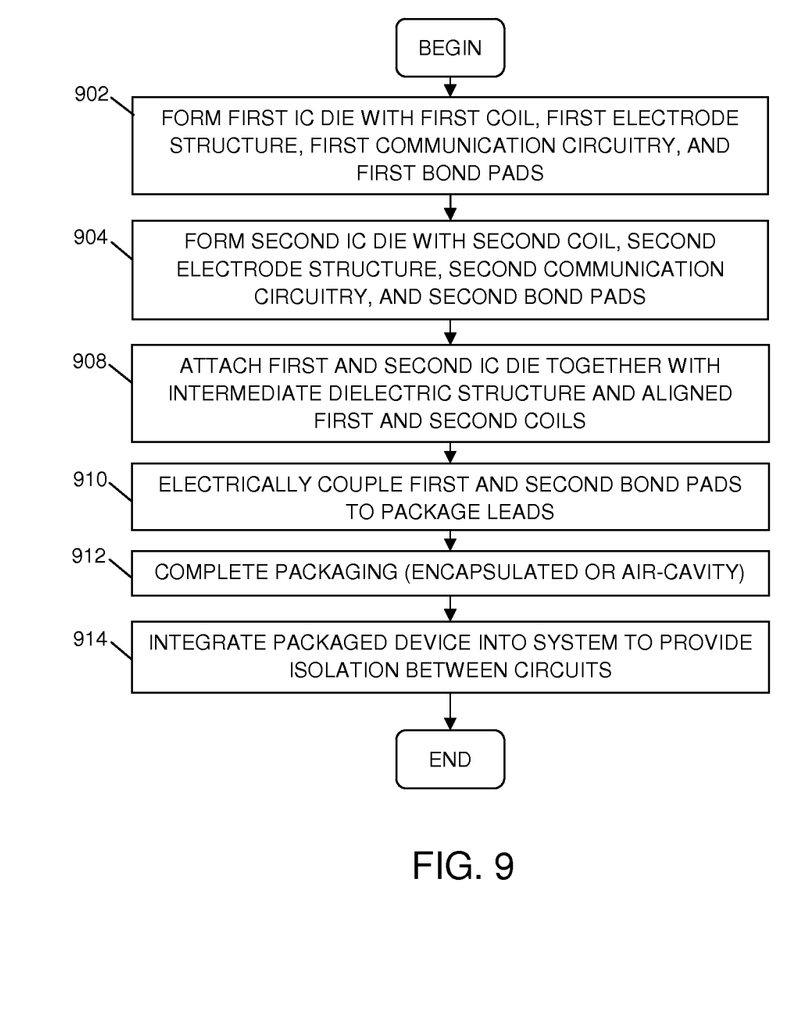
FIG. 9 is a flowchart of a method for manufacturing an inductive communication device, according to an example embodiment.

FIG. 9 is a flowchart of a method for manufacturing IC die (e.g., IC die 210, 230, 300, 410, 430, FIGS. 2-4) and corresponding inductive communication devices (e.g., device 200, FIG. 2), according to an example embodiment. The method may begin, in blocks 902 and 904, by forming first and second IC die (e.g., IC die 210, 230, 300, 410, 430) for inclusion in the inductive communication device. For example, formation of the first and second IC die may include forming various components associated with one or more instantiations of transmitter, receiver, and/or transceiver circuitry (e.g., communication circuitry 214, 234, 330, 414, 434, FIGS. 2-4) within an integrated circuit substrate (e.g., substrate 302, FIG. 3). In addition, a build-up structure (e.g., structure 310, FIG. 3) may be formed on a top surface of the semiconductor substrate, where the build-up structure includes a plurality of patterned conductive layers (e.g., layers 311-315, FIG. 3) and dielectric layers (e.g., layers 316-320, FIG. 3).

During formation of the build-up structure, the plurality of conductive layers may be patterned to form conductive traces, and conductive vias may be formed through the dielectric layers between conductive layers to provide for electrical communication between the layers. A plurality of bond pads (e.g., bond pads 216, 236, 350, 416, 436, FIGS. 2-4) may be formed in an uppermost conductive layer (e.g., conductive layer 315, FIG. 3) to provide for electrical connectivity with the communication circuitry. In addition, during formation of the build-up structure, one or more coils (e.g., coils 212, 232, 340, 412, 432, FIGS. 2-44), each of which includes multiple substantially-concentric conductive rings may be formed using one or more of the uppermost conductive layers of the build-up structure (e.g., using layers 313-315, FIG. 3). According to an embodiment, one or more electrode structures (e.g., electrode structures 215, 235, 352, 450, 454, 650, FIGS. 2-6) also are formed using one or more of the conductive layers of the build-up structure (e.g., using layer 312, FIG. 3). As described in detail previously, portions of the coil and portions of the electrode structure form first and second electrodes, respectively, of a CM noise reduction capacitor (e.g., capacitor 213, 233, 350, FIGS. 2, 3). The coil and electrode structure are electrically coupled to the communication circuitry and/or bond pads of the IC die.

In block 908, the first and second IC die are attached together with an intermediate dielectric structure and aligned first and second coils. For example, in an embodiment, the first IC die may be attached (e.g., using die attach material) to a support substrate (e.g., support substrate 270, FIG. 2). For example, the support substrate may form a portion of a leadframe that also includes a plurality of leads (e.g., leads 272, 274, FIG. 2). A dielectric structure (e.g., dielectric structure 240, 440, 540, 640, FIGS. 2-6) may be placed on or affixed to the first IC die so that the dielectric structure substantially covers the portion of the exterior surface of the first IC die proximate to the coil(s). The second IC die may then be oriented so that the exterior surface to which its coil(s) are proximate faces the dielectric structure. The coils of the first and second IC die may then be aligned, and the second IC die may be placed on or affixed to the dielectric structure (e.g., essentially resulting in the assembly of FIG. 4).

In block 910, the bond pads of the first and second IC die may then be electrically connected to the package leads. For example, in an embodiment, the bond pads may be wire-bonded to the package leads (e.g., by connecting wirebonds 250, 260 between bond pads 216, 236 and leads 272, 274, FIG. 2). In alternate embodiments, for manufacturability reasons, the wirebonds (e.g., wirebonds 260, FIG. 2) that couple to the second IC die may be attached to the die pads of the second IC die prior to assembly step 908, and those wirebonds subsequently may be attached to the leads (e.g., lead 274, FIG. 2) after assembly step 908. In still other embodiments, as mentioned previously, either or both of the IC die may be electrically connected to the package leads through one or more additional IC die, TSVs, conductive structures on a surface of the dielectric structure, or by other means.

In block 912, packaging of the inductive communication device may then be completed. For example, when the inductive communication device is housed within an overmolded package, a mold may be oriented around the leadframe, and non-conductive encapsulant (e.g., plastic encapsulant) may be dispensed into the mold and cured. Conversely, when the inductive communication device is housed within an air-cavity package, a cap may be attached over the top of the device to establish an air cavity within which the first and second IC are positioned.

In block 914, the packaged inductive communication device may then be integrated into a system in which galvanic isolation between circuits is desired (e.g., system 100, FIG. 1). For example, as discussed previously, embodiments of inductive communication devices described herein may be incorporated into a battery charging system for an HEV, a portion of an AC power isolation system, an isolated gate driver, or other types of system in which galvanic isolation between first and second circuits is desired.

It should be understood that the various method steps illustrated in FIG. 9 may be performed in orders other than the example order illustrated, and/or the method may include more, fewer, or different steps. In addition, certain steps may be collapsed into a single step, and other single steps may be expanded into multiple steps. In addition, certain ones of the method steps may be performed in parallel, rather than serially. Those of skill in the art would understand how to modify the illustrated flowchart in manners that produce substantially the same result. Accordingly, such modifications are intended to be included within the scope of the inventive subject matter.

An embodiment of a transformer-based system includes a first coil, a second coil aligned with the first coil across a gap, and a first capacitor coupled between the first coil and a first voltage reference. A further embodiment of a transformer-based system also includes a second capacitor coupled between the second coil and a second voltage reference.

An embodiment of a device includes a first IC die. The first IC die includes a first IC substrate having a first IC substrate surface, a plurality of first alternating conductive layers and dielectric layers formed over the first IC substrate surface, a first coil formed from portions of a first set of conductive layers of the plurality of first alternating conductive and dielectric layers, and a first electrode structure formed from a portion of a second set of conductive layers of the plurality of first alternating conductive and dielectric layers. The plurality of first alternating conductive and dielectric layers has a first exterior surface. The first coil and the first electrode structure are electrically insulated from each other, and at least a portion of the first coil is configured as a first electrode of a first capacitor, and the first electrode structure is configured as a second electrode of the first capacitor.

According to a further embodiment, the device also includes a second IC die. The second IC die includes a second IC substrate having a second IC substrate surface, a plurality of second alternating conductive layers and dielectric layers formed over the second IC substrate surface, a second coil formed from portions of a first set of conductive layers of the plurality of second alternating conductive and dielectric layers, and a second electrode structure formed from a portion of a second set of conductive layers of the plurality of second alternating conductive and dielectric layers. The plurality of second alternating conductive and dielectric layers has a second exterior surface. The second coil and the second electrode structure are electrically insulated from each other, and at least a portion of the second coil is configured as a first electrode of a second capacitor, and the second electrode structure is configured as a second electrode of the second capacitor. The first IC die and the second IC die are arranged within the device so that the first exterior surface of the first IC die faces the second exterior surface of the second IC die, and the first coil and the second coil are aligned with each other across a gap between the first IC die and the second IC die, and the first IC die and the second IC die are galvanically isolated from each other. The device further includes one or more dielectric components within the gap, which are positioned directly between the first coil and the second coil.

An embodiment of a method of manufacturing an inductive communication device includes forming a first IC die and a second IC die, and attaching the first and second IC die together. The first IC die includes a first coil and a first capacitor coupled between the first coil and a first voltage reference node, and the first coil is proximate to an exterior surface of the first IC die. The second IC die includes a second coil and a second capacitor coupled between the second coil and a second voltage reference node, and the second coil is proximate to an exterior surface of the second IC die. The first and second IC die are attached together with the exterior surface of the first IC die facing the exterior surface of the second IC die, and with the first and second coils aligned across a gap.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A device comprising:
   a first integrated circuit (IC) die that includes:
   a first IC substrate having a first IC substrate surface;
   a first build-up structure connected to the first IC substrate surface, wherein the first build-up structure includes a plurality of parallel first alternating conductive layers and dielectric layers formed on the first IC substrate surface, wherein the plurality of first alternating conductive and dielectric layers has a first exterior surface;
   a first coil formed from portions of a first set of conductive layers of the plurality of first alternating conductive and dielectric layers, wherein first and second terminals of the first coil are configured to be electrically coupled to first communication circuitry; and
   a first capacitor that includes a first electrode formed from a portion of the first coil, a second electrode formed from a second conductive layer of the plurality of first alternating conductive and dielectric layers, and first dielectric material between the first set of conductive layers and the second conductive layer that electrically isolates the first electrode and the second electrode from each other, wherein the second electrode includes a plurality of conductive fingers that extend across the first coil outwardly from a location that is vertically offset from a center of the first coil so that the first coil and the plurality of conductive fingers are capacitively coupled, and wherein the second electrode is electrically coupled to a voltage reference of the first IC die.

2. The device of claim 1, wherein the first capacitor has a capacitance value in a range of 10 femtofarad (fF) to 1000 fF.

3. The device of claim 1, wherein the first set of conductive layers is proximate to the exterior surface, and wherein the second conductive layer is positioned between the first IC substrate surface and the first set of conductive layers.

4. The device of claim 1, wherein the second electrode comprises;
   a conductive inner ring that is vertically offset from the center of the first coil; and
   the plurality of conductive fingers connected to and extending outwardly from the conductive inner ring.

5. The device of claim 4, wherein
the conductive inner ring includes a gap.

6. The device of claim 1, further comprising:
   a second IC die that includes:
      a second IC substrate having a second IC substrate surface,
      a second build-up structure connected to the second IC substrate surface, wherein the second build-up structure includes a plurality of second alternating conductive layers and dielectric layers formed on the second IC substrate surface, wherein the plurality of second alternating conductive and dielectric layers has a second exterior surface,
      a second coil formed from portions of a first set of conductive layers of the plurality of second alternating conductive and dielectric layers, and
      a second capacitor that includes a third electrode formed from at least a portion of the second coil, a fourth electrode formed from a portion of a second set of conductive layers of the plurality of second alternating conductive and dielectric layers, and second dielectric material that electrically isolates the third electrode and the fourth electrode from each other,
   wherein the first IC die and the second IC die are arranged within the device so that the first exterior surface of the first IC die faces the second exterior surface of the second IC die, and the first coil and the second coil are aligned with each other across a gap between the first IC die and the second IC die, and wherein the first IC die and the second IC die are galvanically isolated from each other; and
   one or more dielectric components within the gap, which are positioned directly between the first coil and the second coil.

7. The device of claim 6, wherein:
the first IC die further includes the first communication circuitry coupled to the first coil; and
the second IC die further includes second communication circuitry coupled to the second coil.

8. The device of claim 7, wherein:
the first communication circuitry is positioned within a footprint of the first coil; and
the second communication circuitry is positioned within a footprint of the second coil.

9. The device of claim 6, wherein the one or more dielectric components includes a dielectric material with a thickness in a range of about 25 micrometers to about 400 micrometers.

10. The device of claim 6, wherein the first IC die, the second IC die, and the one or more dielectric components are packaged together in an air-cavity package.

11. The device of claim 6, wherein the first IC die, the second IC die, and the one or more dielectric components are packaged together in an overmolded package.

12. A transformer-based system comprising:
a first coil formed from first portions of a first set of conductive layers of a first integrated circuit (IC) die, wherein first and second terminals of the first coil are configured to be electrically coupled to first communication circuitry;
a second coil aligned with the first coil across a gap, wherein the second coil is formed from portions of a second set of conductive layers of a second IC die; and
a first capacitor within the first IC die and including a first electrode, a second electrode, and first dielectric material between the first and second electrodes that electrically isolates the first and second electrodes from each other, wherein the first electrode and the second electrode are completely electrically isolated from each other, the first electrode of the first capacitor is formed from at least a portion of the first coil, and the second electrode of the first capacitor includes a plurality of conductive fingers that extend across the first coil outwardly from a location that is vertically offset from a center of the first coil so that the first coil and the plurality of conductive fingers are capacitively coupled, and the second electrode is coupled to a first voltage reference.

13. The transformer-based system of claim 12, further comprising:
a second capacitor with a first electrode and a second electrode, wherein the second electrode of the second capacitor is coupled between the second coil and a second voltage reference.

14. The transformer-based system of claim 13, wherein:
at least a portion of the second coil forms the first electrode of the second capacitor.

15. The transformer-based system of claim 12, further comprising:
the first communication circuitry coupled to the first coil, wherein the first communication circuitry is configured to convert an input signal into a time-varying drive signal, and to provide the time-varying drive signal to the first coil, the first coil is configured to convert the time-varying drive signal into a time-varying magnetic field around the first coil, the first and second coils are arranged so that the time-varying magnetic field couples with the second coil, and the second coil is configured to convert the time-varying magnetic field into an alternating signal; and
second communication circuitry coupled to the second coil, wherein the second communication circuitry is configured to receive the alternating signal, and to convert the alternating signal into an approximate version of the input signal.

16. The transformer-based system of claim 15, further comprising:
a second capacitor with a first electrode and a second electrode, wherein the second electrode of the second capacitor is coupled between the second coil and a second voltage reference; and
a dielectric structure between the first coil and the second coil,
wherein the first coil, the first capacitor, and the first communication circuitry form portions of the first IC die, and
the second coil, the second capacitor, and the second communication circuitry form portions of the second IC die.

* * * * *